United States Patent
Lehr et al.

(10) Patent No.: US 7,416,992 B2
(45) Date of Patent: Aug. 26, 2008

(54) METHOD OF PATTERNING A LOW-K DIELECTRIC USING A HARD MASK

(75) Inventors: Matthias Lehr, Dresden (DE); Peter Huebler, Coswig (DE); Christian Zistl, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 275 days.

(21) Appl. No.: 11/287,632

(22) Filed: Nov. 28, 2005

(65) Prior Publication Data

US 2006/0246711 A1 Nov. 2, 2006

(30) Foreign Application Priority Data

Apr. 29, 2005 (DE) .................... 10 2005 020 060

(51) Int. Cl.
*H01L 21/44* (2006.01)
*H01L 21/00* (2006.01)
(52) U.S. Cl. .................. 438/723; 438/692; 438/724; 438/725; 438/734; 438/952; 257/E21.029; 257/E21.257; 257/E21.277; 257/E21.579
(58) Field of Classification Search ................. 438/692, 438/694, 723–739
See application file for complete search history.

(56) References Cited

U.S. PATENT DOCUMENTS

| | | | |
|---|---|---|---|
| 6,184,142 B1 * | 2/2001 | Chung et al. ................. | 438/692 |
| 6,350,700 B1 * | 2/2002 | Schinella et al. ............ | 438/723 |
| 6,380,096 B2 * | 4/2002 | Hung et al. .................. | 438/723 |
| 6,410,437 B1 | 6/2002 | Flanner et al. .............. | 438/689 |
| 6,514,849 B1 | 2/2003 | Hui et al. .................... | 438/618 |
| 6,680,252 B2 * | 1/2004 | Chen et al. .................. | 438/691 |
| 6,686,296 B1 * | 2/2004 | Costrini et al. ............. | 438/725 |
| 6,689,695 B1 | 2/2004 | Lui et al. .................... | 438/700 |
| 6,787,452 B2 * | 9/2004 | Sudijono et al. ............ | 438/637 |
| 6,972,259 B2 * | 12/2005 | Wang et al. ................. | 438/694 |
| 6,979,579 B1 * | 12/2005 | Kim et al. ..................... | 438/14 |
| 7,022,602 B2 * | 4/2006 | Ruelke et al. ............... | 438/640 |
| 2004/0115565 A1 | 6/2004 | Lassig et al. ................ | 430/313 |
| 2004/0121604 A1 | 6/2004 | Nieh et al .................. | 438/694 |
| 2004/0127016 A1 | 7/2004 | Hoog et al. ................. | 438/637 |
| 2004/0185674 A1 | 9/2004 | M'Saad et al. ............. | 438/761 |
| 2006/0205207 A1 * | 9/2006 | Chen et al. .................. | 438/638 |

* cited by examiner

*Primary Examiner*—Michael S Lebentritt
(74) *Attorney, Agent, or Firm*—Williams, Morgan & Amerson, P.C.

(57) ABSTRACT

By using a non-metallic hard mask for patterning low-k dielectric materials of advanced semiconductor devices, an enhanced degree of etch fidelity is obtained. The present invention may readily be applied to via first-trench last, trench first-via last schemes.

20 Claims, 8 Drawing Sheets

METHOD OF PATTERNING A LOW-K DIELECTRIC USING A HARD MASK

BACKGROUND OF THE INVENTION

1. Field of the Invention

Generally, the present invention relates to the formation of integrated circuits, and, more particularly, to patterning low-k dielectrics used in metallization layers by means of sophisticated lithography and anisotropic etch techniques.

2. Description of the Related Art

In modern integrated circuits, minimum feature sizes, such as the channel length of field effect transistors, have reached the deep sub-micron range, thereby steadily increasing performance of these circuits in terms of speed and/or power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip.

In integrated circuits having minimum dimensions of approximately 0.35 µm and less, a limiting factor of device performance is the signal propagation delay caused by the switching speed of the transistor elements. As the channel length of these transistor elements has now reached 0.09 µm and less, it turns out, however, that the signal propagation delay is no longer limited by the field effect transistors, but is limited, owing to the increased circuit density, by the close proximity of the interconnect lines, since the line-to-line capacitance is increased in combination with a reduced conductivity of the lines due to their reduced cross-sectional area. The parasitic RC time constants therefore require the introduction of new types of material for forming the metallization layer.

Traditionally, metallization layers are formed by a dielectric layer stack including, for example, silicon dioxide and/or silicon nitride, with aluminum as the typical metal. Since aluminum exhibits significant electromigration at higher current densities than may be necessary in integrated circuits having extremely scaled feature sizes, aluminum is being replaced by copper or copper alloys, which have a significantly lower electrical resistance and a higher resistivity against electromigration. For devices having feature sizes of 0.09 µm and less, it turns out that simply replacing aluminum with copper does not provide the required decrease of the parasitic RC time constants, and therefore the well-established and well-known dielectric materials silicon dioxide (k≈4.2) and silicon nitride (k>5) are increasingly replaced by so-called low-k dielectric materials. However, the transition from the well-known and well-established aluminum/silicon dioxide metallization layer to a low-k dielectric/copper metallization layer is associated with a plurality of issues to be dealt with.

For example, copper may not be deposited in relatively high amounts in an efficient manner by well-established deposition methods, such as chemical and physical vapor deposition. Moreover, copper may not be efficiently patterned by well-established anisotropic etch processes. Therefore, the so-called damascene or inlaid technique is frequently employed in forming metallization layers including copper lines. Typically, in the damascene technique, the dielectric layer is deposited and then patterned with trenches and vias that are subsequently filled with copper by plating methods, such as electroplating or electroless plating. Although the damascene technique is presently a well-established technique for forming copper metallization layers in standard dielectric materials, such as silicon dioxide, the employment of low-k dielectrics, however, requires the development of new dielectric diffusion barrier layers to avoid copper contamination of adjacent material layers, as copper readily diffuses in a plurality of dielectrics. Although silicon nitride is known as an effective copper diffusion barrier, silicon nitride may not be considered as an option in low-k dielectric layer stacks owing to its high permittivity. Therefore, presently, silicon carbide is deemed as a viable candidate for a copper diffusion barrier. It turns out, however, that copper's resistance against electromigration strongly depends on the interface between the copper and the adjacent diffusion barrier layer. Therefore, in sophisticated integrated circuits featuring high current densities, it is generally preferable to use up to 20% nitrogen in the silicon carbide layer, thereby remarkably improving the electromigration behavior of copper compared to pure silicon carbide.

A further problem in forming low-k copper metallization layers has been under-estimated in the past and is now considered a major challenge in the integration of low-k dielectrics. During the patterning of the low-k dielectric material, advanced photolithography is required to image the structure, including vias and/or trenches, into the photoresist that is sensitive in the deep UV range. In developing the photoresist, certain portions of the resist, which have been exposed, may however not be completely removed as required and thus the structure may then not be correctly transferred into the underlying low-k dielectric material during the subsequent etch process. The effect of insufficiently exposing and developing the photoresist is also referred to as resist poisoning. It is believed that a significant change of the resist sensitivity may be caused by an interaction of nitrogen and nitrogen radicals with the resist layer, thereby locally modifying the resist structure after resist development. The problem is becoming even more important as the wavelength of the lithography used is reduced as a consequence of more sophisticated process requirements. For instance, currently the patterning of critical features sizes of cutting edge devices may be performed on the basis of a 193 nm light source, requiring appropriately designed photoresists that are highly sensitive in this wavelength range. It turns out, however, that with increased sensitivity at shorter wavelengths, the available photoresists also exhibit an increased sensitivity for resist poisoning mechanisms. Since the introduction of the 90 nm technology may also require a correspondingly advanced lithography in the formation of a metallization layer contacting the circuit elements, increased problems may occur during the patterning of the low-k dielectric as nitrogen and/or compounds may readily be present within the low-k material and other layers in the layer stack, which then may interact with the resist exhibiting the increased sensitivity to resist poisoning.

Furthermore, the reduction of sizes of the trenches and vias to be etched into the low-k dielectric may increase the burden of the resist mask in terms of etch selectivity as for high precision photolithography, possibly requiring an exposure wavelength of 193 nm, moderately thin resist layers are necessary, thereby reducing the "fidelity" of the etch process due to excessive "erosion," for instance, corner rounding, of the resist mask. With increasing aspect ratio of vias and trenches, the reduced etch fidelity may increasingly cause inter-connect failure or reduced interconnect reliability.

In view of the situation described above, there is a need for an improved technique enabling the patterning of a low-k dielectric layer for highly scaled semiconductor devices while avoiding or at least reducing one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique for patterning a low-k dielectric material, as is typically used in sophisticated semiconductor devices for the formation of metallization layers, wherein the patterning process is at least partially based on a hard mask layer, which, in turn, is patterned by using sophisticated lithography for forming a corresponding resist layer. In particular embodiments, the hard mask layer is substantially comprised of non-metallic components, thereby providing enhanced process flexibility, in that well-established processes and materials may be used, and optical characteristics of the hard mask, or at least portions thereof, may be specifically designed to act as an anti-reflective coating (ARC) layer during the lithography.

According to one illustrative embodiment of the present invention, a method comprises forming a patterned hard mask over a low-k dielectric layer of a semiconductor metallization layer and patterning the low-k dielectric layer by anisotropically etching the low-k dielectric layer using the patterned hard mask as an etch mask.

BRIEF DESCRIPTION OF THE DRAWINGS

The invention may be understood by reference to the following description taken in conjunction with the accompanying drawings, in which like reference numerals identify like elements, and in which.

Figure 1A:
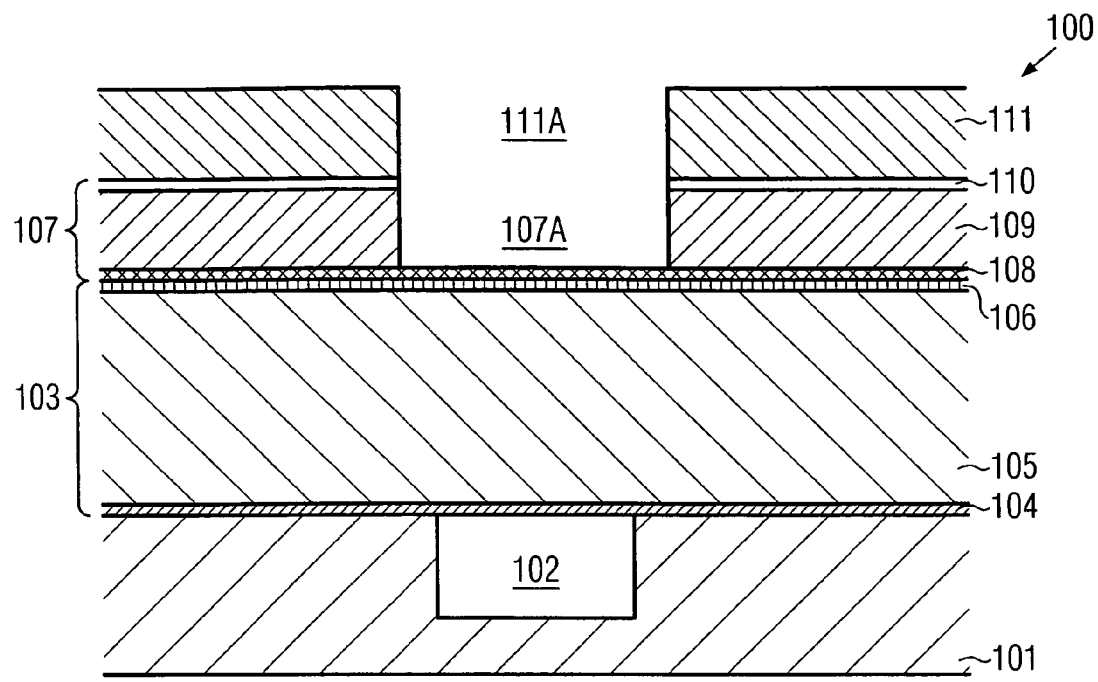
FIGS. 1a-1e schematically show cross-sectional views of a semiconductor device including a metallization layer with a low-k dielectric material, wherein a trench is patterned in the low-k dielectric material prior to the formation of a via on the basis of a hard mask according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is based on the concept that the patterning process of highly sophisticated integrated circuits comprising metallization layers with low-k dielectric materials may significantly be improved in that the patterning process of the low-k dielectric material is, at least partially, based on a hard mask to significantly relax constraints imposed on a photoresist mask that is conventionally used for patterning trenches and vias into the low-k dielectric material. As previously discussed, the dimensions and the aspect ratios of the corresponding trenches and vias may approach 100 nm and even less in sophisticated devices, thereby requiring advanced lithography techniques using short exposure wavelengths, such as 193 nm and less, and corresponding photoresists sensitive in these wavelength ranges. Since the corresponding resist layers may not be formed with an arbitrary thickness, owing to optical constraints, the resist mask may not insure the required masking effect during the subsequent etch process, which may lead to a reduced "fidelity" of the etched trenches and vias, thereby also reducing the uniformity and, thus, the reliability of the resulting metal lines and metal vias, especially as feature sizes are scaled down. Moreover, resist poisoning effects, i.e., the interaction of the highly sensitive photoresists for 193 nm and less, may additionally contribute to a reduced etch fidelity.

According to the present invention, many of these problems may be solved or at least reduced by using a hard mask, at least partially, in the patterning process of the low-k dielectric layer. A hard mask is to be understood as a material that exhibits higher mechanical stability, in particular at elevated temperatures, compared to a photoresist material. In particular embodiments, the hard mask may be comprised of a non-metallic material, which allows the employment of well-approved formation and deposition techniques for dielectric materials, such as silicon dioxide, silicon nitride, silicon oxynitride, amorphous carbon and the like, wherein appropriate material compositions and layer compositions may be selected to take into consideration the specifics of the entire patterning process and/or optical characteristics of the hard mask layer, since it may, in some embodiments, also be used as an ARC layer. With reference to the accompanying drawings, further illustrative embodiments of the present invention will now be described in more detail.

FIG. 1a schematically shows a semiconductor device 100 comprising a substrate 101, which may include circuit elements, such as transistors, capacitors and the like. For convenience and to not obscure the present invention, such elements are not shown in FIG. 1a. The substrate 101 may have formed therein a metal region or contact region 102, which may represent a region for contacting a circuit element or which may represent a metal line of a corresponding metallization layer. The semiconductor device 100 further comprises a metallization layer 103, which may comprise an etch stop layer 104, for instance, comprised of silicon nitride, silicon carbide, nitrogen-enriched silicon carbide and the like. Above the layer 104, a low-k dielectric layer 105 may be formed, which may be comprised of any appropriate dielectric material having a relative permittivity of 3.5 or less. For example, a plurality of polymer materials well-known in the art may be used for the low-k dielectric layer 105. In other cases, a combination of silicon, carbon, oxygen and hydrogen, represented by the formula SiCOH, may be used. The metallization layer 103 may further comprise a cap layer 106 formed of any appropriate material so as to endow the low-k dielectric layer 105 with desired mechanical characteristics. For instance, the cap layer 106 may be comprised of silicon dioxide. It should be appreciated, however, that the layer and material composition of the metallization layer 103 is only of illustrative nature, and that any other combination of dielectric materials including a low-k dielectric material may be used.

Formed above the metallization layer 103 is a hard mask 107 having formed therein a trench 107A. The hard mask 107 may be comprised of a single dielectric layer composed of a material that exhibits a sufficient etch selectivity to the metallization layer 103, or at least the low-k dielectric layer 105, for a specified anisotropic etch recipe for patterning the metallization layer 103. For example, in one illustrative embodiment, the hard mask 107 may be substantially comprised of silicon dioxide with an appropriate thickness to provide sufficient protection during a subsequent etch process. In other illustrative embodiments, the hard mask 107 may, at least partially, be comprised of amorphous carbon, since amorphous carbon exhibits a high etch resistivity against various well-known etch recipes for etching the low-k dielectric material layer 105. In other embodiments, the hard mask 107 may comprise one or more sub-layers having different material compositions. For example, silicon nitride and/or silicon oxynitride may be used in combination with silicon dioxide and/or amorphous carbon. In some embodiments, the hard mask 107 may comprise an etch stop layer 108 formed under a layer 109, wherein the etch stop layer 108 may have a significantly reduced thickness compared to the layer 109 and may exhibit a high etch selectivity with respect to the layer 109 for one or more specific recipes as are well known in the art. For instance, the layer 109 may be comprised of silicon dioxide, whereas the etch stop layer 108 may include silicon nitride, wherein, however, any other appropriate material compositions may be used. In other embodiments, the etch stop layer 108 may be omitted. Moreover, in one illustrative embodiment, the hard mask 107 may comprise a cap layer 110, which may be comprised of a substantially nitrogen-free material, thereby reducing the risk of resist poisoning of a resist mask 111 formed above the hard mask 107. For example, if the layer 109 may comprise nitrogen or any other material that should not come in direct contact with the resist mask 111, the cap layer 110 may be provided, for instance in the form of silicon dioxide, silicon carbide and the like, so as to substantially prevent a chemical reaction of the photoresist with any nitrogen or nitrogen radicals. In one illustrative embodiment, the hard mask 107, or at least portions thereof, for instance, the cap layer 110 and the layer 109, may be formed to act as an ARC layer during the patterning of the resist mask 111. For this purpose, at least one optical characteristic of the hard mask 107 may be determined in advance, which may be appropriate to reduce any back-reflection of a specified exposure radiation into the resist layer during the lithography process for patterning the resist mask 111. As previously discussed, for ever decreasing feature sizes, exposure wavelengths of 193 nm and even less may be used for the photolithography process. Consequently, optical characteristics, such as the index of refraction and the extinction coefficient of the hard mask 107, may be selected, by appropriately choosing the material composition thereof, to obtain in combination with a specified layer thickness the desired anti-reflective effect. Thus, a target value for at least one optical characteristic may be selected in advance and may be used in subsequent formation processes to obtain the required characteristics of hard mask 107.

In one illustrative embodiment, the cap layer 110 may be comprised of silicon dioxide and the layer 109 may be comprised of amorphous carbon, wherein a thickness of the silicon dioxide is approximately 10 nm or less so as to not unduly affect the overall optical behavior of the hard mask 107, whereas the layer 109, i.e., the amorphous carbon, is provided with a layer thickness in the range of approximately 30-60 nm so as to provide the required optical thickness to act as an ARC layer. In other illustrative embodiments, the layer 109 may be comprised of silicon oxynitride, wherein the material composition, i.e., the ratio of oxygen and nitrogen, is adjusted to obtain the desired optical behavior. In still other illustrative embodiments, a separate ARC layer may be provided in addition to the hard mask 107 in order to individually adapt the hard mask to etch-specific requirements, while, nevertheless, providing the potential for a specific adjustment of the optical characteristics during the lithography process for patterning the resist mask 111. For convenience, such an additional ARC layer is not shown.

A typical process flow for forming the semiconductor device 100 as shown in FIG. 1a may comprise the following processes. After the formation of any circuit elements, including the contact or metal region 102 by well-established techniques, the metallization layer 103 may be formed by depositing the etch stop layer 104, for instance, by well-established plasma enhanced chemical vapor deposition (PECVD) techniques or any other appropriate deposition methods, followed by the formation of the low-k dielectric layer 105, which may be accomplished by well-established spin-on techniques and/or chemical vapor deposition (CVD) techniques. Thereafter, the cap layer 106, if provided, may be formed, for instance, by CVD, followed by the deposition of a hard mask layer having a material composition as is discussed above with respect to the hard mask 107. For example, well-established PECVD techniques for the formation of dielectric materials, such as silicon nitride, silicon dioxide, silicon oxynitride, silicon carbide, nitrogen-enriched silicon carbide, amorphous carbon and the like, may be employed, wherein, as previously discussed, a respective deposition process may be controlled on the basis of at least one target value for at least one optical characteristic of the hard mask layer to obtain the specified optical behavior, when the hard mask 107 is simultaneously used as an ARC layer.

Subsequently, a further optional ARC layer may be deposited and a resist layer may be formed above the hard mask layer, wherein advantageously a thickness of the resist layer may be selected in accordance with lithography specific constraints, rather than in view of its etch behavior during an anisotropic etch process for the metallization layer 103, as is the case in the conventional resist technique, since the resist layer is, in this stage of manufacturing, used for patterning the hard mask 107 only. Thus, in the subsequent photolithography, the resist layer may be patterned to form the resist mask 111 having formed therein a trench 111A, the dimensions of which are defined with high precision. Moreover, as previously explained, in some particular embodiments, at least portions of the hard mask, i.e., the hard mask layer, are comprised of a substantially nitrogen-free material, so as to significantly reduce the effect of resist poisoning, thereby also improving the overall accuracy of the patterning process. For instance, at least the cap layer 110 may be comprised of a substantially nitrogen-free material, such as silicon dioxide.

After the formation of the resist mask 111, the hard mask layer may be patterned to receive the trench 107A according to the dimensions of the trench 111A by performing an appropriate anisotropic etch process on the basis of well-established process recipes, which are designed to etch through the material or materials of the hard mask layer. When the etch stop layer 108 is provided, the etch process through the layer 109 may reliably be stopped in and on the layer 108. Thereafter, the resist mask 111 may be removed on the basis of well-established resist removal processes, such as an etching process on the basis of an oxygen plasma.

Figure 1B:
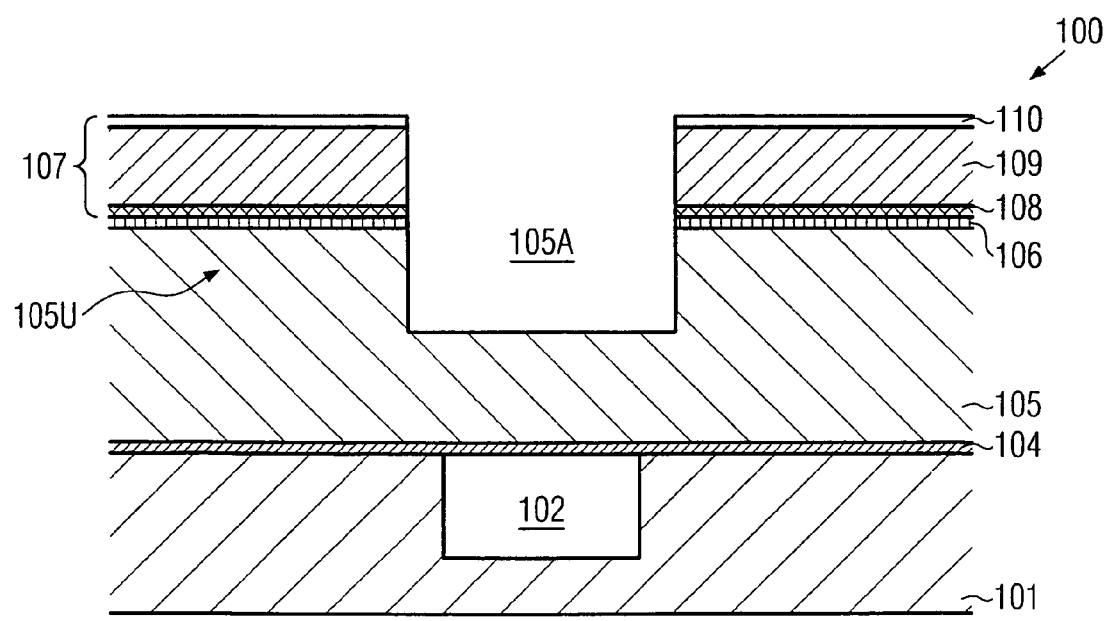

FIG. 1b schematically shows the semiconductor device 110 in a further advanced manufacturing stage. Here, a trench 105A is formed in an upper portion 105U of the low-k dielectric layer 105. During the formation of the trench 105A, the etch stop layer 108 and the cap layer 106 may be opened by any appropriate anisotropic or isotropic etch recipes, followed by an anisotropic etch process to form the trench 105A, while the hard mask 107 acts as an etch mask, thereby providing enhanced fidelity and increased etch resistivity compared to a conventional resist mask.

Figure 1C:
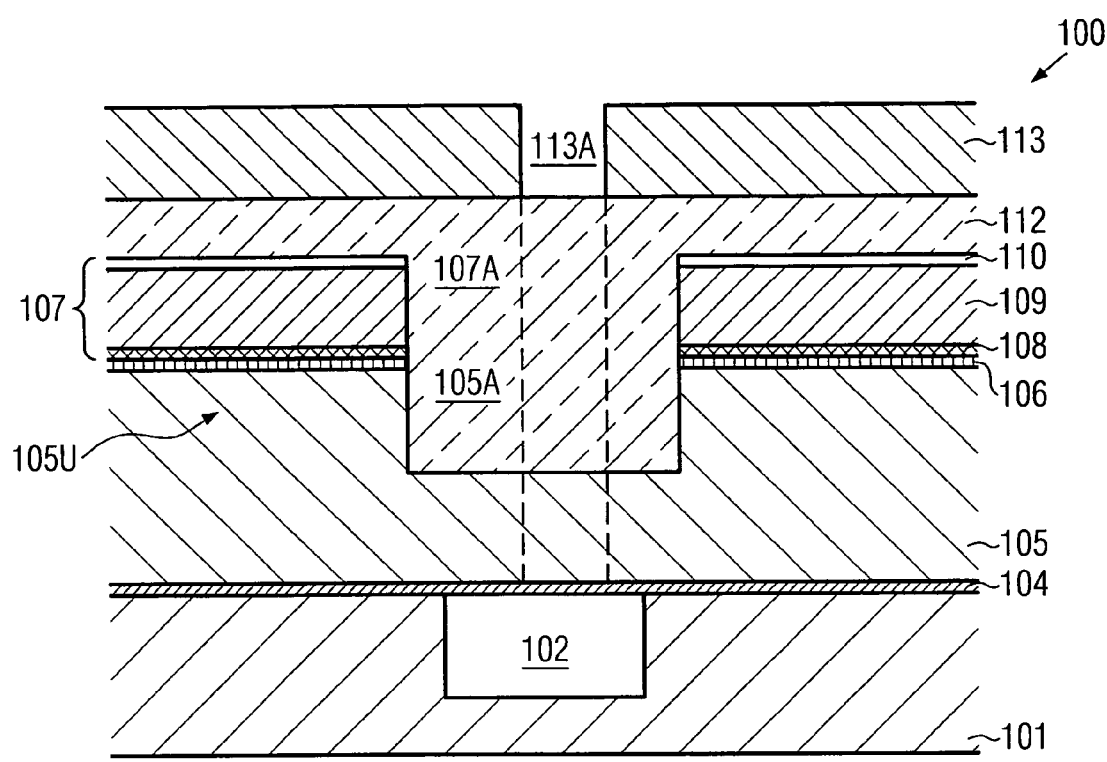

FIG. 1c schematically shows the semiconductor device 100 with a second resist mask 113 formed above the hard mask 107. Moreover, an organic ARC layer 112 is formed between the second resist mask 113 and the hard mask 107. The organic ARC layer 112 may also fill the trench 105A and the trench 107A. The ARC layer 112 may be formed by well-established spin-on techniques or other methods for applying a liquid polymer material as are typically employed in dual damascene techniques for forming vias and trenches. Thereafter, a resist layer may be deposited and may be patterned to form a via opening 113A therein which is to be used as an etch mask for forming a via through the dielectric layer 105. To this end, an appropriate anisotropic etch recipe may be applied to etch through the ARC material 112 and, after reaching the bottom of the trench 105A, through the remaining low-k dielectric layer 105. During this etch process, the resist mask 113 may insure a high etch fidelity, at least within the material 112, which may then act as a further etch mask for etching through the dielectric layer 105, even if the resist mask 113 or at least significant portions thereof are already consumed by the etch process. Due to the presence of the hard mask 107, however, upper portions of the trench 105A remain substantially unaffected by the anisotropic etch, even if significant amounts of the ARC material 112 may be consumed, in case the resist mask 113 is completely consumed during the anisotropic etch process. Thereafter, the resist mask 113, if not consumed by the etch process, and the residues of the ARC layer 112 may be removed by well-established selective etch recipes.

Figure 1D:
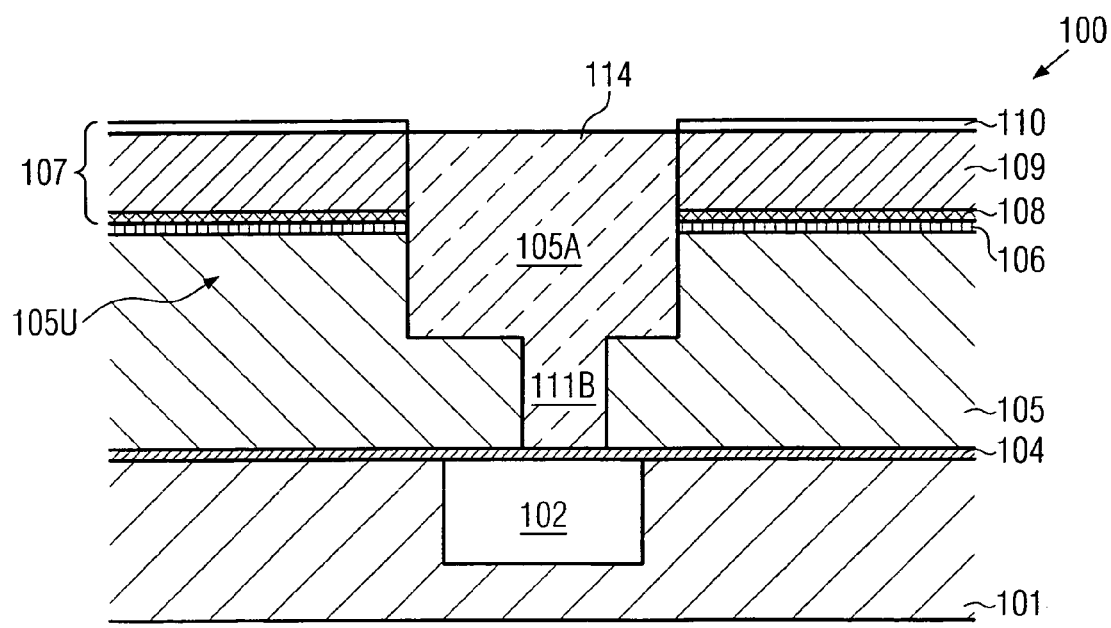

FIG. 1d schematically shows the semiconductor device 100 in a further advanced manufacturing stage in accordance with illustrative embodiments of the present invention. In these embodiments, the hard mask 107 may be removed after the formation of the trench 105A and a via opening 111B extending from the bottom of the trench 105A to the etch stop layer 104. For this purpose, the trench 105A and the via opening 111B may be filled by an appropriate material 114, such as a photoresist, any other organic material, such as an ARC material, and the like. In FIG. 1d, the trench 105A is shown to be filled substantially up to the hard mask layer 107, while, in other embodiments, the trench 105A may be filled only partially. For example, the via opening 111B and the trench 105A may be filled by coating the device 100 by photoresist and exposing the photoresist to remove the resist from horizontal portions of the hard mask and recessing the resist 114 within the trench 105A. Thereafter, the hard mask 107, or at least portions thereof, may be removed by a selective etch process, which may be designed as an isotropic etch process and/or an anisotropic etch process. The etch process may be designed to stop at the etch stop layer 108, if provided, or on the cap layer 106. It should be appreciated that the etch process does not require a specific etch selectivity between the material 114 and the materials of the etch stop layer 107 as long as an etch rate of the material 114 is similar to the etch rate of the material of the hard mask 107, when the trench 105A is filled so as to be substantially flush with the hard mask 107, as is shown in FIG. 1d. In other cases, when the material 114 is significantly recessed within the trench 105A, an etch recipe may be used exhibiting a moderately high selectivity between the material 114 and the hard mask 107.

In other embodiments, the device 100 as shown in FIG. 1d may be subjected to a chemical mechanical polishing (CMP) process for removing the hard mask 107 or at least portions thereof. In this case, the material 114 provides the required mechanical stability of the metallization layer 103 during the CMP process. In this case, one or both of the layers 108 and 106 may act as CMP stop layers so as to be able to reliably determine the end of the CMP process, thereby also providing a high process uniformity. For example, the layer 108 may be provided in the form of a silicon nitride layer, which exhibits a significant increased hardness, thereby acting as a mechanical stop layer.

Figure 1E:
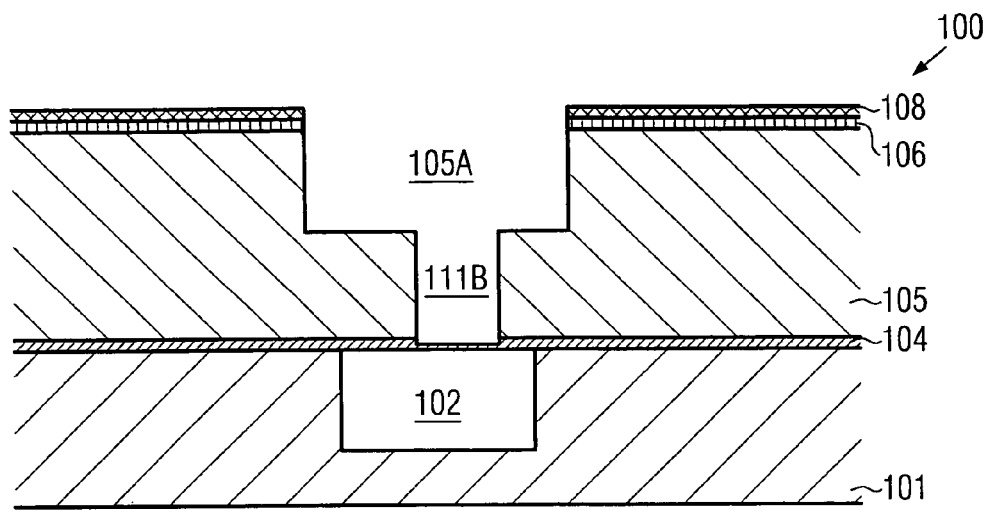

FIG. 1e schematically shows the device 100 after the completion of an etch process and/or a CMP process for removing the hard mask 107 or at least portions thereof. In this example, the hard mask 107 may be substantially removed, wherein the stop layer 108 may still be present. The stop layer 108 may then be removed by any appropriate selective etch process, irrespective whether the stop layer 108 has been used during a CMP process or during a selective etch process. Moreover, the material 114 may be removed, for instance, by well-established etch processes on the basis of an oxygen plasma. Thereafter, the further processing of the device 100 may be continued by, for instance, opening the etch stop layer 104 and forming a barrier layer and a seed layer in the trench 105A and the via opening 111B. Thereafter, a metal may be filled in to form metal lines and metal vias, as will be described in more detail with reference to FIGS. 3a-3g.

As a consequence, the process for patterning the metallization layer 103 may be significantly enhanced for highly scaled devices requiring trench widths of 100 nm and even less and vias with a diameter of 100 nm and even less with an aspect ratio of 4 and more, in that the hard mask 107 is provided, in particular embodiments, as a non-metallic material for patterning at least the trench 105A to achieve a high etch fidelity even if a resist for 193 nm exposure wavelengths is used.

Figure 2A:
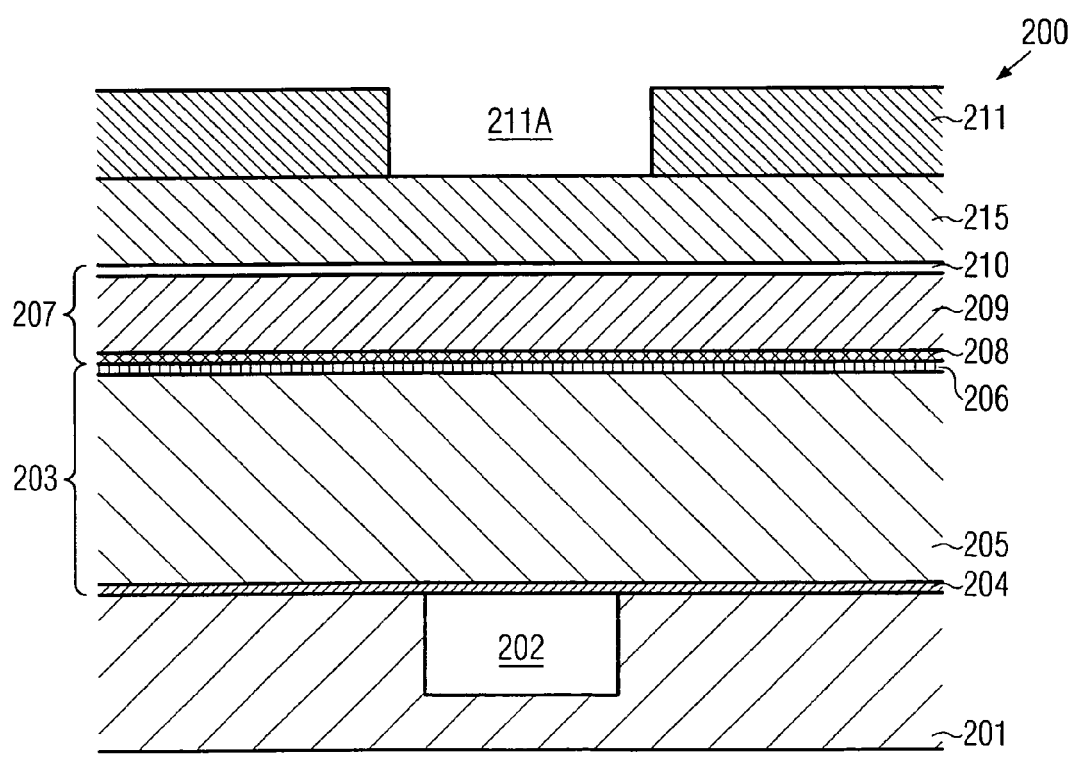
FIGS. 2a-2c schematically show cross-sectional views during the patterning of a low-k dielectric material in accordance with further illustrative embodiments of the present invention, wherein a trench is formed in the hard mask with a subsequent patterning process for forming a via through the low-k dielectric layer and a subsequent trench etch process according to further illustrative embodiments of the present invention.
Figure 2B:
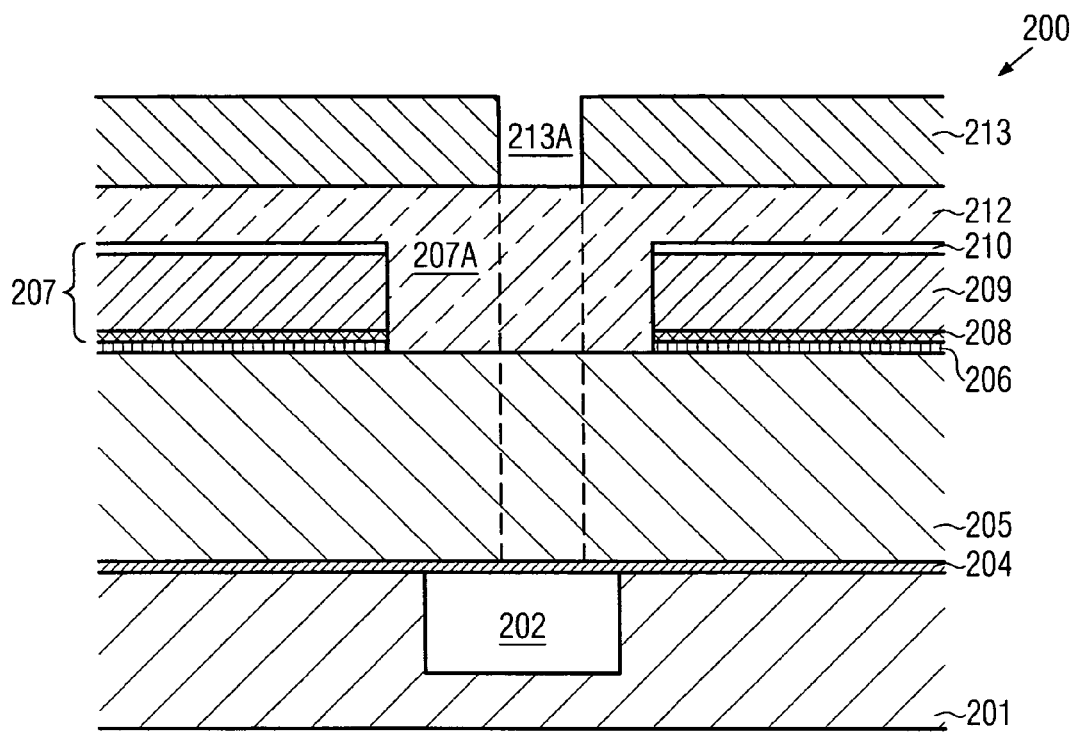
Figure 2C:
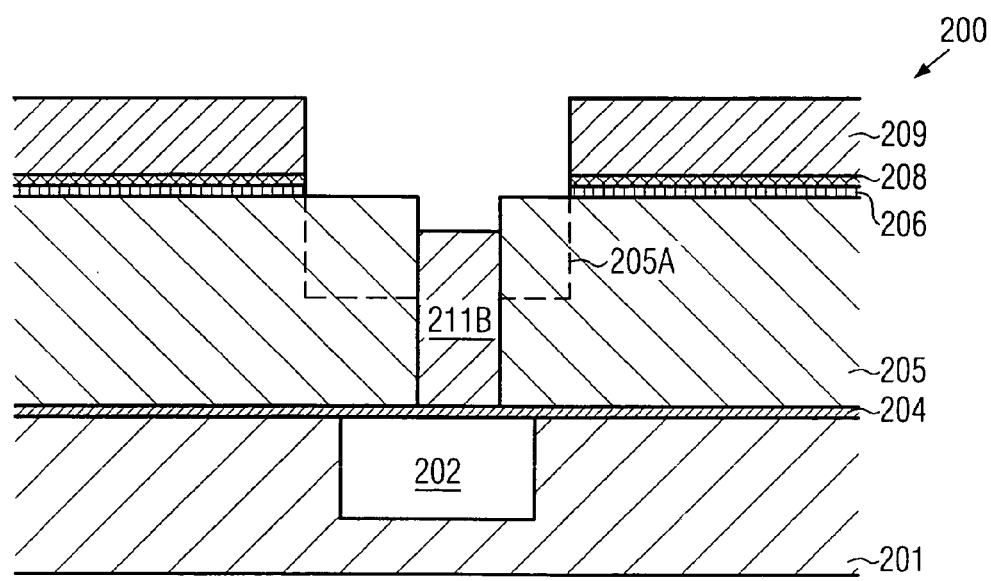

With reference to FIGS. 2a-2c, further illustrative embodiments of the present invention will now be described in more detail. When describing these embodiments, similar or identical components are denoted by the same reference numerals except for the leading digit, which is a "2" rather than a "1" as in FIGS. 1a-1e. Consequently, a more detailed description of the corresponding components will be omitted and the criteria discussed above regarding the formation and the material composition of any such components also apply in these embodiments.

FIG. 2a schematically shows a semiconductor device 200 comprising a substrate 201 having formed thereon a contact or metal region 202 followed by a metallization layer 203, which may comprise a cap layer 206 and an etch stop layer 204, with a low-k dielectric layer 205 imposed therebetween. A hard mask layer 207, which may comprise one or more layers, such as a cap layer 210 and an etch stop layer 208, and a layer 209 disposed therebetween, is provided above the metallization layer 203. In some embodiments, an optional ARC layer 215 may be formed on the hard mask layer 207, when the material composition and thickness of the hard mask layer 207 may not be adapted to provide the reflectivity characteristics required in a subsequent photolithography process with a specified exposure wavelength. In other embodiments, the optional ARC layer 215 may be omitted and the corresponding optical characteristics of the hard mask layer 207, or at least portions thereof, may be adapted to provide the required anti-reflective characteristics, as is also described with reference to FIG. 1a. The device 200 further comprises a resist mask 211 having formed therein a trench opening 211A.

A typical process flow for forming the device 200 as shown in FIG. 2a may comprise substantially the same process steps as are already described with reference to FIG. 1a. Then, after the formation of the resist mask 211, an anisotropic etch process may be performed to pattern the trench 211A into the hard mask layer 207, as is also previously described with respect to FIGS. 1a and 1b. Thereafter, the resist mask 211 may be removed by any appropriate resist removal processes. If the optional ARC layer 215 is provided, this layer may also be removed, either commonly with or separately to the resist mask 211.

FIG. 2b schematically shows the semiconductor device 200 in a further advanced manufacturing stage. The device 200 comprises an ARC layer 212 formed of an organic material, wherein the ARC layer 212 also fills the trench 207A of the hard mask layer 207 which has been formed on the basis of the trench 211A (FIG. 2a). Moreover, a second resist mask 213 may be formed on the ARC layer 212 above the trench 207A, which comprises a via opening 213A. The ARC layer 212 and the resist mask 213 may be formed by well-established processes similar to those described with reference to FIGS. 1c and 1d. Thereafter, an anisotropic etch process may be performed to etch through the metallization layer 203, thereby forming a corresponding opening through the low-k dielectric layer 205 extending down to the etch stop layer 204. During this anisotropic etch process, the erosion of the second resist mask 213 may not unduly affect hard mask 207 due to its high resistivity against the etch chemistry. After the completion of the anisotropic etch process, the ARC layer 212 and second resist mask 213 may be removed by well-established processes.

FIG. 2c schematically shows the semiconductor device 200 wherein a via opening 211B, that has been formed during the preceding anisotropic etch process, is filled at least partially with any appropriate material, such as a photoresist, to protect the via 211B during a subsequent trench etch process, which is designed as an anisotropic etch process while using the hard mask layer 207 as an etch mask for forming a corresponding trench 205A, as is indicated by dashed lines in FIG. 2c. Thereafter, the trench 205A may be filled with any appropriate organic material, possibly after the removal of the organic material within the via opening 211B, and the hard mask 207 may be removed, at least partially, by a correspondingly designed etch process and/or by a CMP process, as is also described with reference to FIG. 1d. Thereafter, the material may be removed and the manufacturing sequence may be continued by opening the stop layer 204 and filling in any appropriate metal or metal-containing materials. In other embodiments, the opening of the stop layer 204 and the filling in of metal may be performed with the hard mask layer 207 still in place, wherein the removal process may be performed at a later stage, as is described in more detail later on.

With reference to FIGS. 3a-3e, further illustrative embodiments of the present invention will now be described, wherein identical reference numerals are used for similar or identical components as are already described with reference to FIGS. 1a-1e and FIGS. 2a-2c, whereas a leading "3" is used instead of a leading "1" or "2."

Figure 3A:
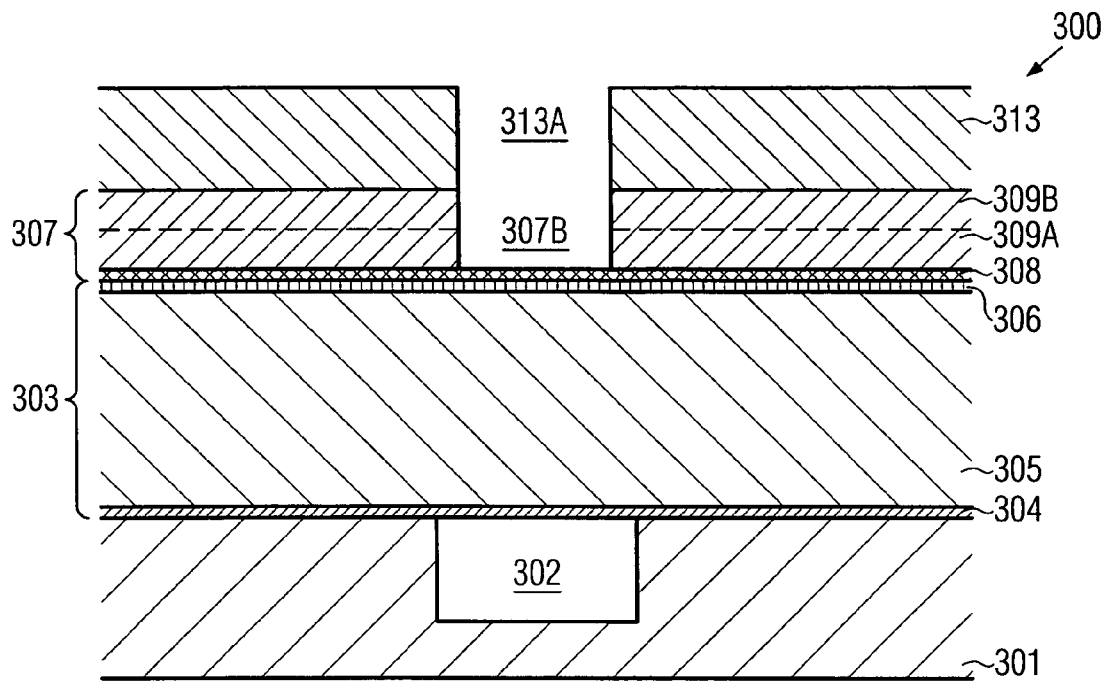
FIGS. 3a-3g schematically depict cross-sectional views of a semiconductor device during the patterning of a low-k dielectric layer, wherein a via is first formed through the low-k dielectric layer by means of a hard mask and subsequently a trench is formed in accordance with still other illustrative embodiments of the present invention.

In FIG. 3a, a semiconductor device 300 comprises a substrate 301 having formed thereon a contact region or metal region 302, followed by a metallization layer 303 which may include an etch stop layer 304, a low-k dielectric layer 305 and a cap layer 306. As previously already noted, other configurations for the low-k dielectric metallization layer 303 may be used in accordance with device requirements. A hard mask 307 is formed above the metallization layer 303, wherein the hard mask 307 may comprise one or more sub-layers and materials as specified above. For example, the hard mask 307 may comprise an etch stop layer 308, a first mask layer 309A and a second mask layer 309B, which may be comprised of materials that exhibit a high etch selectivity to each other with respect to a specified etch recipe. Moreover, the first and second mask layers 309A, 309B may both exhibit a moderately high etch selectivity to the low-k dielectric layer 305. In other embodiments, the hard mask 307 may have a composition and structure as is described with regard to the previous embodiments. For example, the material composition of the hard mask 307 may be selected to act as an ARC layer in a subsequent photolithography process. In the embodiments shown, at least the second mask layer 309B may be designed to act as an ARC layer for a specified exposure wavelength. Moreover, the upper portion of the hard mask 307, i.e., the mask layer 309B or a portion thereof or a separate layer formed above the mask layer 309B, may be formed of a substantially nitrogen-free material, such as silicon dioxide, amorphous carbon, silicon carbide and the like. It should also be appreciated that at least one of the first and second layers 309A, 309B may be comprised of two or more sub-layers. For example, an additional cap layer (not shown) may be incorporated in the second mask layer 309B, in particular when the layer 309B is comprised of a material that may not get in indirect contact with photoresist material.

Moreover, the semiconductor device 300 comprises a resist mask 313 formed above the hard mask 307, wherein the resist mask 313 may be formed on the hard mask 307 when the hard mask is configured to also act as an ARC layer, whereas, in other embodiments, an optional ARC layer (not shown) may be provided between the resist mask 313 and the hard mask 307. The resist mask 313 is patterned to comprise a via opening 313A.

A typical process flow for forming the semiconductor device 300 as shown in FIG. 3a may comprise the process sequences as previously described. In particular, a correspondingly designed anisotropic etch process may be performed on the basis of the resist mask 313 to form a via opening 307B within the hard mask 307. For instance, when the resist mask 307 comprises the first and second mask layers 309A, 309B, different etch chemistries may be required for etching through the second mask layer 309B and through the first mask layer 309A, respectively. In other embodiments, a single etch chemistry may be sufficient when the resist mask 313 provides sufficient etch fidelity to reliably form the via opening 307B within the hard mask 307. Thereafter, the resist mask 313 may be removed and a further anisotropic etch process, including any processes required, for instance, for opening the etch stop layer 308 and the cap layer 306, may be performed to etch through the low-k dielectric layer 305.

Figure 3B:
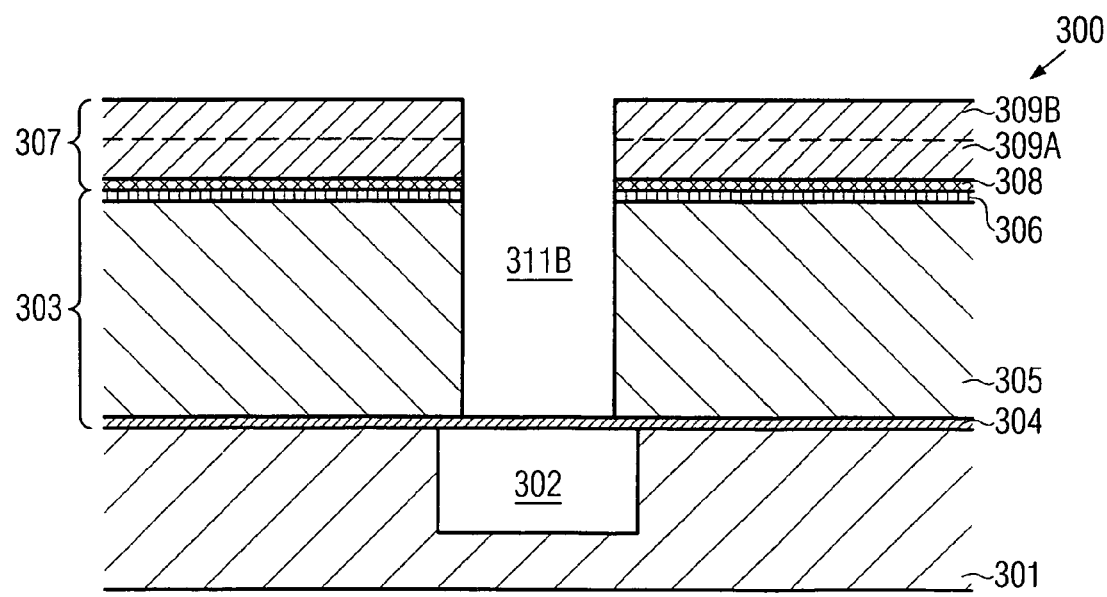

FIG. 3b schematically shows the semiconductor device 300 after the formation of a via opening 311B in the low-k dielectric layer 305. Due to the hard mask 307, a high fidelity of the via opening 311B with respect to the opening 307B may be obtained. In some embodiments, after the formation of the via opening 311B, a further resist mask may be formed for patterning a trench in the upper portion of the low-k dielectric layer 305. Hereby, similar processes as are already described with the patterning of the hard mask layers 107 and 207 may be used. In other embodiments, a portion of the hard mask 307 may be removed to obtain enhanced process uniformity for the subsequent manufacturing processes. For example, the via opening 311B may be filled with an appropriate material, such as photoresist, organic ARC material and the like, and an etch process, isotropic or anisotropic in nature, may be performed to remove an upper portion of the hard mask 307, such as the second mask layer 309B, wherein the etch process may reliably be stopped on the first mask layer 309A due to the high etch selectivity. For example, the second mask layer 309B may be comprised of silicon dioxide, amorphous carbon or any other composition thereof, whereas the first mask layer 309A may be substantially comprised of silicon nitride. Consequently, well-known selective etch recipes may be used to remove the second mask layer 309B without unduly affecting the first mask layer 309A. As a result, a high level of thickness uniformity across the substrate 301 for the subsequent manufacturing processes is obtained.

Figure 3C:
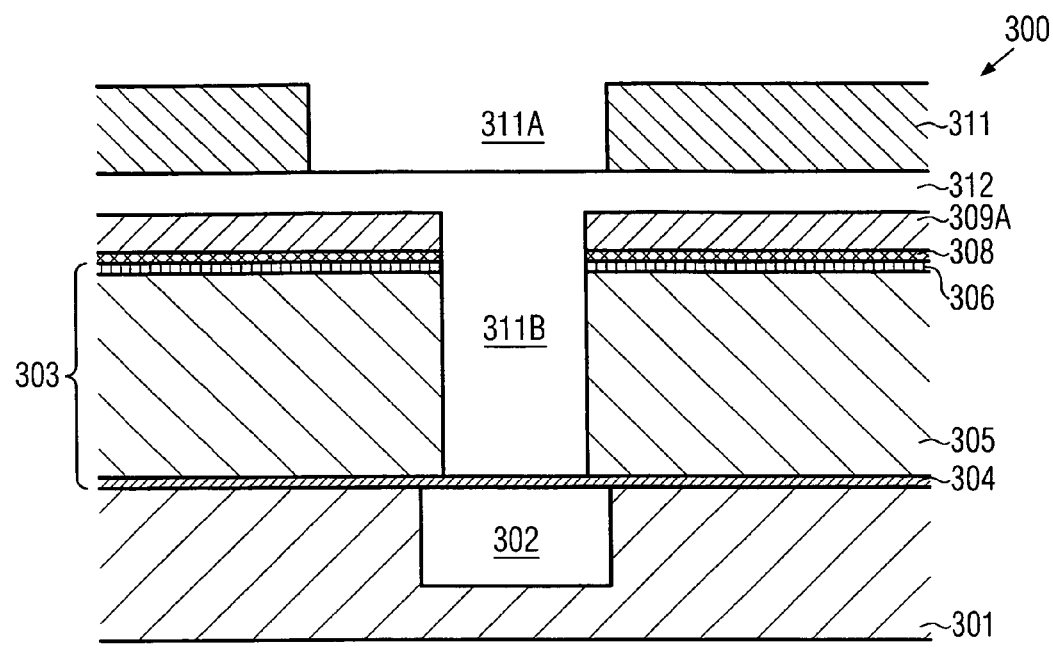

FIG. 3c schematically shows the semiconductor device 300 with a portion of the hard mask 307 removed. The hard mask 307 comprises the first mask layer 309A and the etch stop layer 308, if provided. Moreover, a second resist mask 311 is formed above the mask layer 309A, wherein an organic ARC layer 312 may be formed therebetween. Moreover, the ARC layer 312 may also fill the via opening 311B. The resist mask 311 and the ARC layer 312 may be formed in accordance with well-established processes, as are also described above with reference to the preceding embodiments. Hence, during the formation of the resist mask 311, a corresponding trench opening 311A may be formed therein, which may subsequently be transferred into the remaining hard mask layer 307, that is, into the first mask layer 309A. To this end, an appropriate anisotropic etch process may be carried out to etch through the ARC layer 312 and at least the mask layer 309A. During this anisotropic etch process, the etch stop layer 308, if provided, may reliably stop the etch process, wherein the etch stop layer 308 may then be opened in a separate isotropic or anisotropic etch process.

Figure 3D:
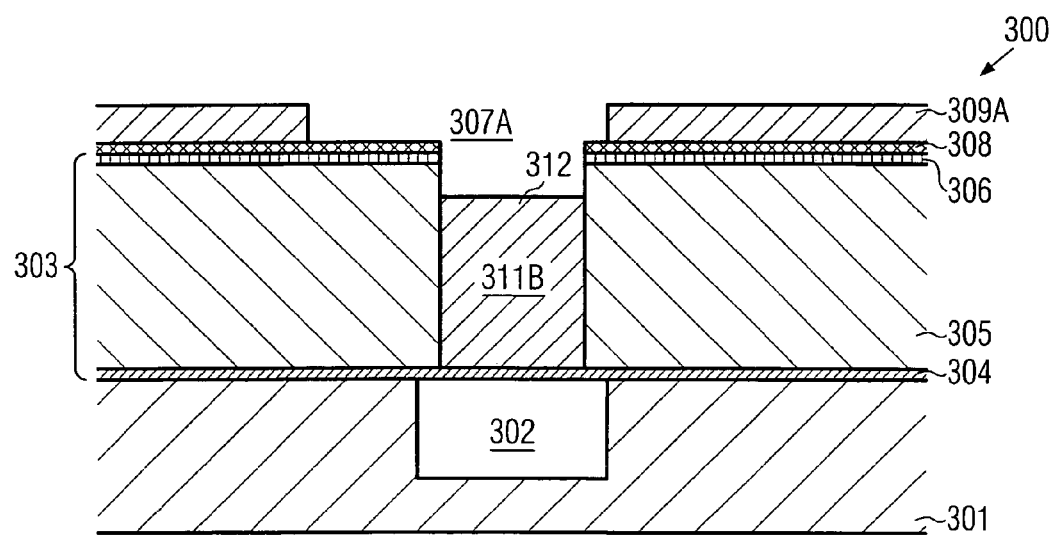

FIG. 3d schematically shows the device 300 after the completion of the above-described anisotropic etch process. Thus, the hard mask 307, i.e., the first mask layer 309A, comprises a corresponding trench opening 307A. The resist mask 311 and the ARC layer 312 may have been removed and the opening may be refilled, or at least a portion of the ARC layer 312 may be left, so as to remain a significant portion of the via opening 311B filled with the material of the layer 312. Thereafter, a further anisotropic etch process may be performed to form a trench in the upper portion of the low-k dielectric layer 305. Thus, during this anisotropic etch process, a high etch fidelity is achieved owing to the etch resistive mask 309A, while the via opening 311B is protected by the remaining material 312 or any other material that may have been newly filled in the via opening 311B when the previous ARC layer 312 has been completely removed.

Figure 3E:
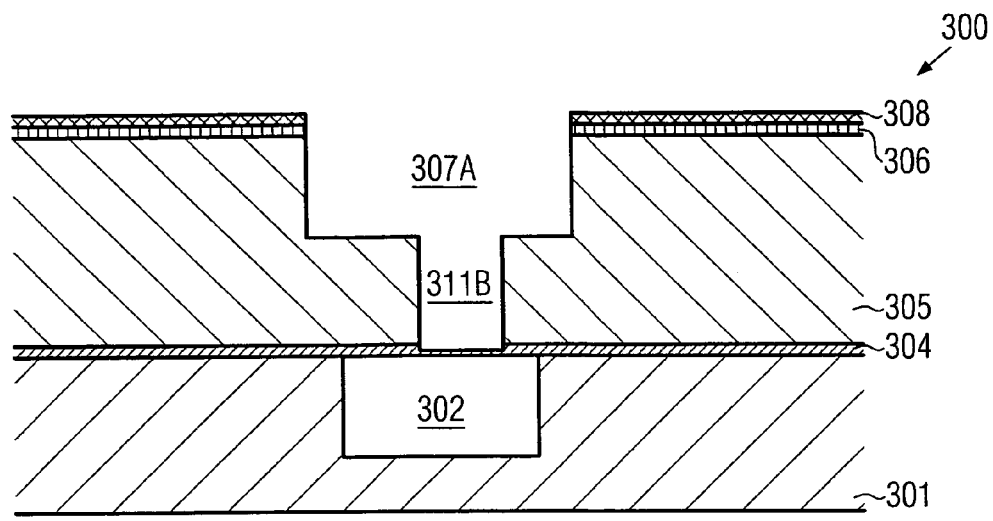

FIG. 3e schematically shows the semiconductor device 300 in a further advanced manufacturing stage in accordance with further illustrative embodiments. In these embodiments, a trench opening 307A is formed in the low-k dielectric layer 305, and the hard mask 307 has been removed, for instance, by any of the previously described process flows. That is, appropriate material, such as photoresist, may be filled into the trench opening 307A and the via opening 311B, and the hard mask 307 may be removed by chemical mechanical polishing and/or an etch process. Thereafter, the further manufacturing process may be continued by filling in any suitable barrier layers and respective metal materials, such as copper and the like.

Figure 3F:
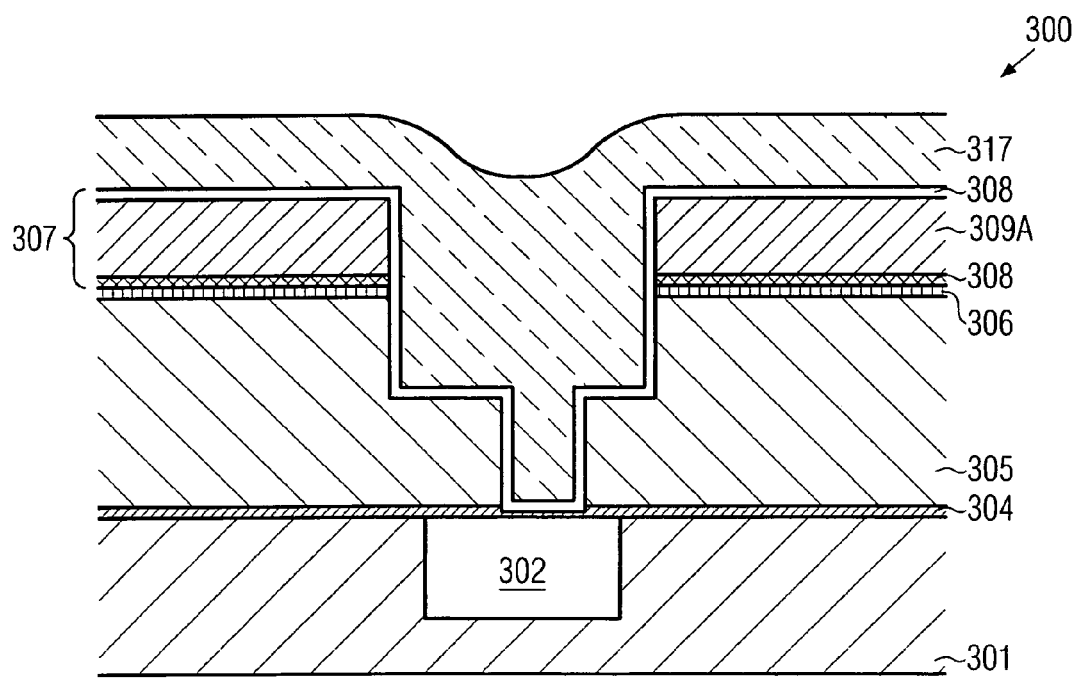

FIG. 3f schematically shows the device 300 according to alternative embodiments, in which the hard mask 307 is not removed and is maintained during the further processing for filling in any appropriate metal materials into the trench 307A and the via opening 311B. FIG. 3f shows the semiconductor device 300 with a barrier layer 316 formed on the hard mask 307 and on surfaces of the trench 307A and the via opening 311 B. Moreover, a metal layer 317 is formed on the barrier layer 316 to substantially completely fill the trench 307A and the via opening 311B. In highly sophisticated semiconductor devices, requiring the formation of metallization layers with metal lines and vias having lateral dimensions of 100 nm and even less, the metal layer 317 may substantially be comprised of copper, copper alloys or other highly conductive metal materials. Moreover, the barrier layer 316 may be comprised of any appropriate materials that prevent diffusion into the metal layer and out of the metal layer and, in particular, that prevent the out-diffusion of copper atoms. For example, the barrier layer 316 may be comprised of one or more layers including materials, such as tantalum, tantalum nitride, titanium, titanium nitride and/or other suitable materials. Typically, the barrier layer 316 may be formed by advanced well-established sputter deposition techniques or by atomic layer deposition (ALD), depending on the device and process requirements. Thereafter, a seed layer may be deposited (not shown), for instance, by sputter deposition, electroless plating, ALD and the like. Next, the metal layer 317 may be deposited by, for instance, electroplating, electroless plating or any combination thereof. In this deposition process, the metal layer 317 may typically be deposited so as to exhibit a certain degree of overfill, thereby requiring the removal of any excess material after the deposition of the metal layer 317. The removal of the excess material of the layer 317 may be accomplished by an electrochemical etch process and/or CMP. During or after the removal of the excess metal of the layer 317, the hard mask 307 may be removed. In one illustrative embodiment, the hard mask 307 is removed by a specifically designed CMP process after the removal of the excess material of the layer 317 by CMP.

Figure 3G:
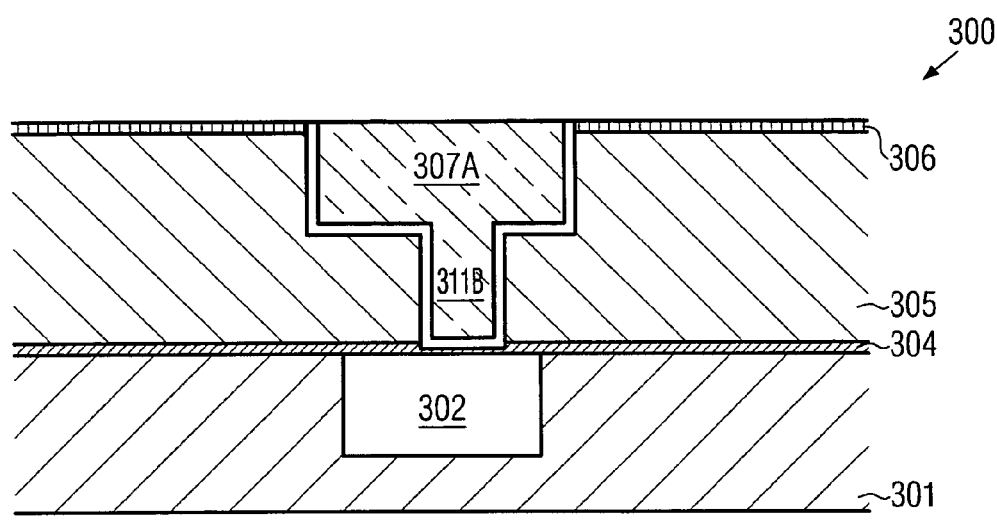

FIG. 3g schematically shows the device 300 after the removal of the hard mask 307, wherein the stop layer 308, if provided, may also have been removed by CMP or by etching, or wherein the cap layer 306 may have been used as a CMP stop layer. Thus, the device 300 comprises a metal-filled line, i.e., the metal-filled trench 307, and a metal-filled via, i.e., the metal-filled via 311B.

As a result, the present invention provides an enhanced technique for patterning low-k dielectric layers of advanced semiconductor devices with a high degree of etch fidelity by using a corresponding hard mask, in particular, a non-metallic hard mask, wherein a high degree of flexibility in designing the overall patterning process is provided. For example, the present invention may readily be applied to any via first-trench last techniques or any trench first-via last techniques in the damascene patterning regime. In addition, the hard mask may be designed to simultaneously act as an ARC layer, thereby reducing process complexity. Moreover, materials may be selected for the non-metallic hard mask to avoid or substantially reduce the risk of resist poisoning as may be encountered in combination with highly sensitive photoresists designed for exposure wavelengths of 193 nm and even less.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a patterned hard mask above a low-k dielectric layer of a semiconductor metallization layer;
   patterning said low-k dielectric layer by anisotropically etching said low-k dielectric layer using said patterned hard mask as an etch mask to form at least one recessed feature in said low-k dielectric layer;
   filling at least a portion of said recessed feature with organic material; and
   removing at least a first portion of said hard mask to reduce a thickness of said hard mask in the presence of said organic material.

2. The method of claim 1, wherein forming said patterned hard mask comprises forming a resist mask above a hard mask layer, patterning said hard mask layer to form said patterned hard mask and removing said resist mask.

3. The method of claim 2, wherein said resist mask is configured to form a trench pattern in said hard mask.

4. The method of claim 3, wherein patterning said low-k dielectric layer comprises forming a trench in an upper portion of said low-k dielectric layer.

5. The method of claim 4, further comprising forming a via from a bottom of said trench through said low-k dielectric layer.

6. The method of claim 1, wherein removing said at least a portion of said hard mask comprises removing said at least a portion by at least one of chemical mechanical polishing and selective etching.

7. The method of claim 1, further comprising:
   removing said organic material after removing the first portion of the hard mask;
   filling said via and said trench with a metal-containing material; and
   removing excess material of said metal-containing material and at least a second portion of said hard mask to further reduce the thickness of said hard mask by at least one of chemical mechanical polishing and selective etching.

8. The method of claim 2, wherein said resist mask is configured to form a via pattern in said hard mask.

9. The method of claim 8, wherein patterning said low-k dielectric layer comprises forming a via opening through said low-k dielectric layer and forming a trench in an upper portion of said low-k dielectric layer around said via.

10. The method of claim 9, wherein forming said trench comprises forming a trench resist mask above said hard mask and patterning said hard mask and said upper portion of said low-k dielectric layer.

11. The method of claim 10, further comprising removing said trench resist mask after patterning said hard mask and prior to patterning said upper portion of said low k dielectric layer.

12. The method of claim 3, further comprising, after patterning said hard mask and removing said resist mask, forming a second resist mask above said hard mask, said second resist mask being configured to define a via opening within said trench of said hard mask.

13. The method of claim 12, further comprising etching a via opening through said low-k dielectric layer using said second resist mask as an etch mask.

14. The method of claim 13, further comprising removing said second resist mask and forming a trench in an upper portion of said low-k dielectric layer using said hard mask.

15. The method of claim 1, wherein said hard mask layer is comprised of non-metallic components.

16. The method of claim 15, wherein said hard mask layer comprises two or more sub-layers, a first sub-layer comprises a first material exhibiting high selectivity to a second material of a second sub-layer with respect to a specific removal recipe, and removing the first portion of said hard mask further comprises removing the first sub-layer.

17. The method of claim 15, wherein at least an upper portion of said hard mask layer is comprised of a substantially nitrogen-free non-metallic material.

18. The method of claim 1, wherein at least a portion of said hard mask layer is comprised of amorphous carbon.

19. The method of claim 2, further comprising determining in advance a target value of at least one optical characteristic of said hard mask layer so as to act as ARC layer during the formation of said resist mask and forming said hard mask layer on the basis of said target value.

20. The method of claim 19, wherein said target value of said at least one optical characteristic is determined for an exposure wavelength of a lithography process of approximately 193 nm.

* * * * *